United States Patent
Naem

(10) Patent No.: US 7,118,973 B1
(45) Date of Patent: Oct. 10, 2006

(54) METHOD OF FORMING A TRANSISTOR WITH A CHANNEL REGION IN A LAYER OF COMPOSITE MATERIAL

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 10/869,158

(22) Filed: Jun. 16, 2004

Related U.S. Application Data

(62) Division of application No. 10/315,300, filed on Dec. 10, 2002, now Pat. No. 6,818,938.

(51) Int. Cl.
*H01L 21/336* (2006.01)

(52) U.S. Cl. ............................. 438/285; 257/E21.065; 257/E21.182; 257/E21.207

(58) Field of Classification Search ........ 257/192–195, 257/E21.065, E21.182, E21.207; 438/93, 438/172, 197, 285
See application file for complete search history.

(56) References Cited

U.S. PATENT DOCUMENTS

| | | | | |
|---|---|---|---|---|
| 6,103,603 A * | 8/2000 | Han | ............................ | 438/532 |
| 6,190,975 B1 | 2/2001 | Kubo et al. | ................... | 438/285 |
| 6,399,970 B1 | 6/2002 | Kubo et al. | ................... | 257/194 |
| 6,472,685 B1 | 10/2002 | Takagi | ........................... | 257/77 |
| 6,492,216 B1 * | 12/2002 | Yeo et al. | .................... | 438/197 |
| 6,512,252 B1 * | 1/2003 | Takagi et al. | ................ | 257/192 |
| 6,597,016 B1 | 7/2003 | Yuki et al. | ...................... | 257/77 |
| 6,707,132 B1 | 3/2004 | Banerjee et al. | ............. | 257/616 |
| 2002/0163027 A1 | 11/2002 | Skotnicki et al. | ............ | 257/302 |
| 2002/0179946 A1 * | 12/2002 | Hara et al. | ................... | 257/288 |
| 2002/0182423 A1 | 12/2002 | Chu et al. | .................... | 428/446 |

OTHER PUBLICATIONS

Wolf, Silicon Processing for the VLSI Era vol. 1: Process Technology; 1986; Lattice Press, Sunset Beach, California; pp. 155.*

* cited by examiner

*Primary Examiner*—Marcos D. Pizarro
(74) *Attorney, Agent, or Firm*—Mark C. Pickering

(57) ABSTRACT

The vertical diffusion of dopants from the gate and the bulk material into the channel region, and the lateral diffusion of dopants from the source and drain regions into the channel region resulting from thermal cycling during the fabrication of a MOS transistor is minimized by forming the source and drain regions in a layer of composite material that includes silicon, germanium, and carbon.

18 Claims, 5 Drawing Sheets

METHOD OF FORMING A TRANSISTOR WITH A CHANNEL REGION IN A LAYER OF COMPOSITE MATERIAL

This is a divisional application of application Ser. No. 10/315,300 filed on Dec. 10, 2002, now U.S. Pat. No. 6,818,938 issued on Nov. 16, 2004. The present application is also related to application Ser. No. 10/315,394 filed on Dec. 10, 2002, now abandoned, and application Ser. No. 10/772,863 filed on Feb. 4, 2004.

DETAILED DESCRIPTION OF THE INVENTION

Figure 1:
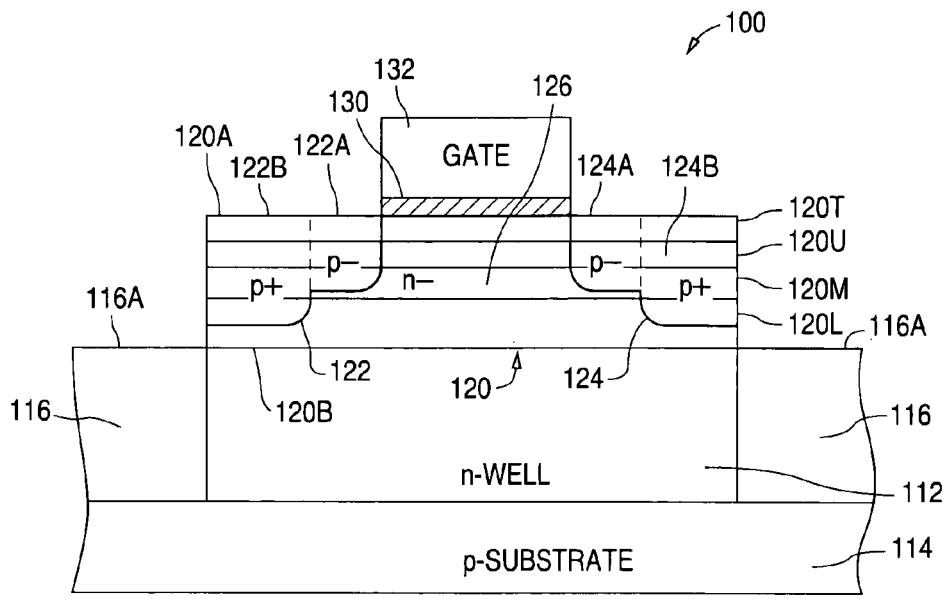
FIG. 1 is a cross-sectional view illustrating an example of a PMOS transistor 100 in accordance with the present invention.

FIG. 1 shows a cross-sectional view that illustrates an example of a PMOS transistor 100 in accordance with the present invention. As described in greater detail below, PMOS transistor 100 utilizes a layer of composite material to limit the diffusion of boron atoms into the channel region of the transistor, thereby minimizing undesired changes in the threshold voltage and channel length of the transistor.

As shown in FIG. 1, PMOS transistor 100 is formed in an n-type semiconductor material 112, such as a substrate or well. In the FIG. 1 example, material 112 is formed as an n-type well in a p-type substrate 114. In addition, material 112' is surrounded by a trench isolation region 116 that has a substantially planar upper surface 116A. (An isolation region with a non-planar upper surface can alternately be used.)

As further shown in FIG. 1, transistor 100 includes a layer of composite material 120 that is formed on semiconductor material 112. In the FIG. 1 example, composite layer 120 has an upper surface 120A, and a lower surface 120B that is substantially coplanar with the upper surface 116A of trench isolation region 116.

In the present invention, composite layer 120 includes a layer of n− silicon carbon 120L that is formed on semiconductor material 112, and a layer of n− silicon germanium 120M, which is substantially free of carbon, that is formed over the layer of silicon carbon 120L. (Layer 120L can optionally include germanium.)

In addition, composite layer 120 includes a layer of n− silicon germanium carbon 120U that is formed over the layer of silicon germanium 120M, and a cap silicon layer 120T that is formed on silicon germanium carbon layer 120U. (Cap silicon layer 120T can optionally be omitted. Layer 120T allows a higher quality of gate oxide to be produced during manufacturing.) Composite layer 120 can alternately be formed to have additional layers.

The layers 120T, 120U, 120M, and 120L can have any thickness required by the device design. For example, silicon carbon layer 120L can be 30 nM thick, silicon germanium layer 120M can be 20 nM thick, silicon germanium carbon layer 120U can be 10 nM thick, and cap silicon layer 120T can be 10 nM thick.

Transistor 100 also includes spaced-apart p-type source and drain regions 122 and 124 that are formed in composite layer 120, and a channel region 126 that is located between source and drain regions 122 and 124. Source and drain regions 122 and 124 can be formed entirely within layer 120, or can alternately extend into material 112.

Further, as shown in the FIG. 1 example, source region 122 includes a lightly-doped p-type region 122A and heavily-doped p-type region 122B, while drain region 124 includes a lightly-doped p-type region 124A and a heavily-doped p-type region 124B. Alternately, source and drain regions 122 and 124 can have a uniform p+ dopant concentration.

Transistor 100 additionally includes a thin layer of insulation material 130, such as a layer of gate oxide, that is formed on composite layer 120 over channel region 126. Further, transistor 100 includes a p-type polysilicon gate 132 that is formed on insulation layer 130 over channel region 126.

Figure 2:
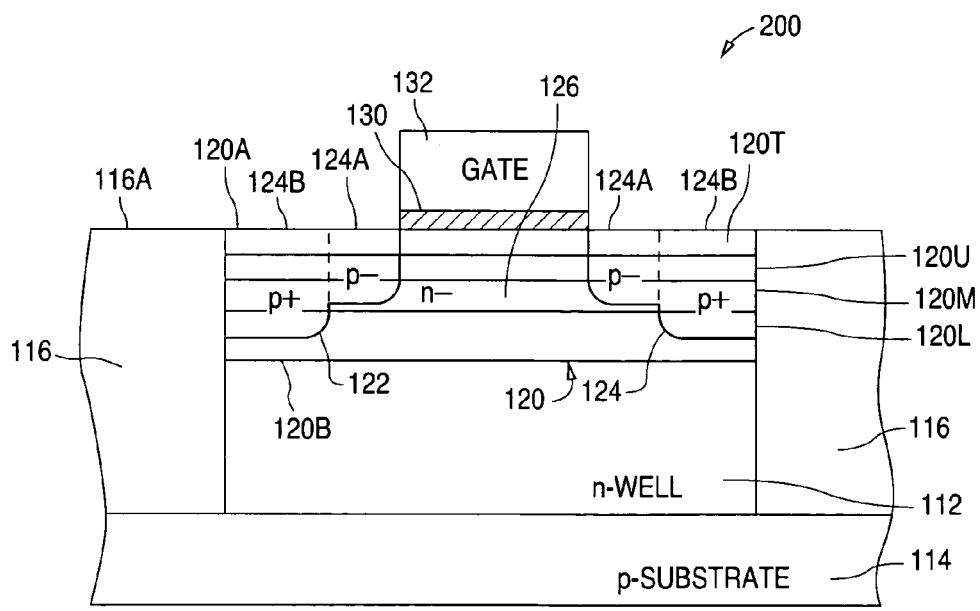
FIG. 2 is a cross-sectional view illustrating an example of a PMOS transistor 200 in accordance with an alternate embodiment of the present invention.

FIG. 2 shows a cross-sectional view that illustrates an example of a PMOS transistor 200 in accordance with an alternate embodiment of the present invention. PMOS transistor 200 is similar to PMOS transistor 100 and, as a result, utilizes the same reference numerals to designate structures that are common to both transistors.

As shown in FIG. 2, transistor 200 differs from transistor 100 with respect to the location of composite layer 120. In transistor 200, the bottom surface 120B of composite layer 120 lies below the top surface 116A of trench isolation region 116, while the top surface 120A of composite layer 120 is substantially coplanar with the top surface 116A of trench isolation region 116. Transistors 100 and 200 are operated in the same way as a conventional MOS transistor such as transistor 100.

One advantage of the present invention is that the carbon in silicon layers 120U and 120L limits the vertical and lateral diffusion, respectively, of boron atoms into silicon germanium layer 120M of channel region 126 during thermal cycling, such as annealing. As a result, the present invention limits undesirable shifts in the threshold voltage and shortening of the channel length that can lead to punch-through.

Another advantage of the present invention is that by locating the channel region in a silicon germanium layer, as described in the present invention, the mobility of the charge carriers (holes in a p-channel) is increased as compared to a channel region located in a region of silicon.

Figure 3A:
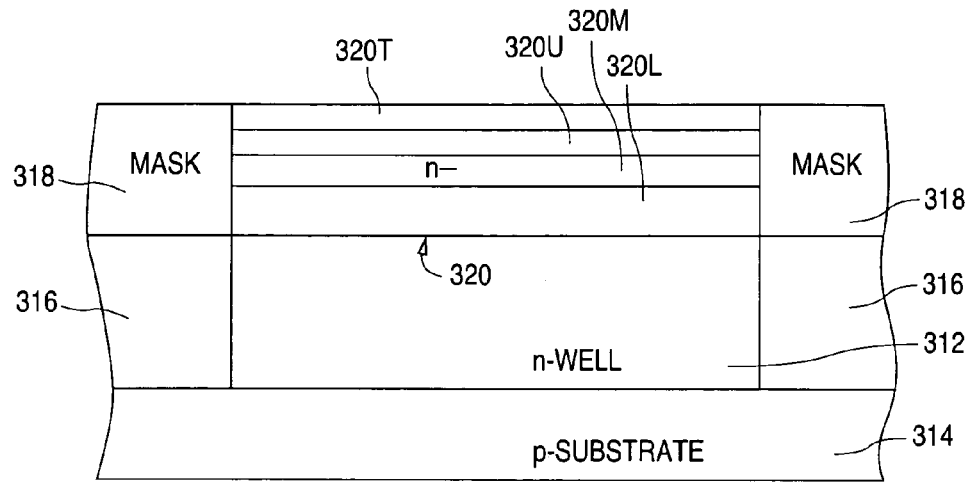
FIGS. 3A–3E are a series of cross-sectional views illustrating an example of a method of forming a PMOS transistor in accordance with the present invention.

FIGS. 3A–3E show a series of cross-sectional views that illustrate an example of a method of forming a PMOS transistor in accordance with the present invention. As shown in FIG. 3A, the method utilizes a conventionally formed wafer that has an n-well 312 that is formed in a p-substrate 314. In addition, the wafer has a trench isolation region 316 that isolates n-well 312 from laterally adjacent regions. Further, n-well 312 and trench isolation region 316 have upper surfaces that are substantially coplanar.

As shown in FIG. 3A, the method begins by forming and patterning a mask 318, such as a hard mask, to expose n-well 312. Next, a layer of composite material 320 is selectively epitaxially grown on the exposed surface of n-well 312. With selective epitaxial growth, composite layer 320 is only grown on the silicon surface of n-well 312.

Composite layer 320 is formed by first forming a layer of n–silicon carbon 320L on the exposed surface of n-well 312. After this, a layer of n– silicon germanium 320M that is substantially free of carbon is formed on layer 320L, followed by the formation of a layer of n– silicon germanium carbon 320U on layer 320M. Next, a layer of cap silicon 320T that is free of carbon and germanium is optionally formed on layer 320U.

The distribution and concentration of the carbon present in layers 320L and 320U depend on when the carbon is introduced, and the amount of carbon that is introduced, during the selective epitaxial growth process. By introducing and restricting carbon during the growth process, a plurality of silicon sub-layers with different carbon concentrations can be formed.

For example, the introduction of carbon near the beginning of the growth process forms lower silicon carbon layer 320L. Stopping the introduction of carbon and introducing germanium near the middle of the process forms middle silicon germanium layer 320M without carbon. In addition, re-introducing carbon near the end of the growth process forms upper silicon germanium carbon layer 320U. Stopping the introduction of carbon and germanium, in turn, forms cap silicon layer 320T.

Following the formation of composite layer 320, the upper surface of layer 320 can optionally be planarized to create a substantially flat upper surface. The upper surface of composite layer 320 can be planarized using, for example, chemical mechanical polishing. Mask 318 is then removed.

Figure 3B:
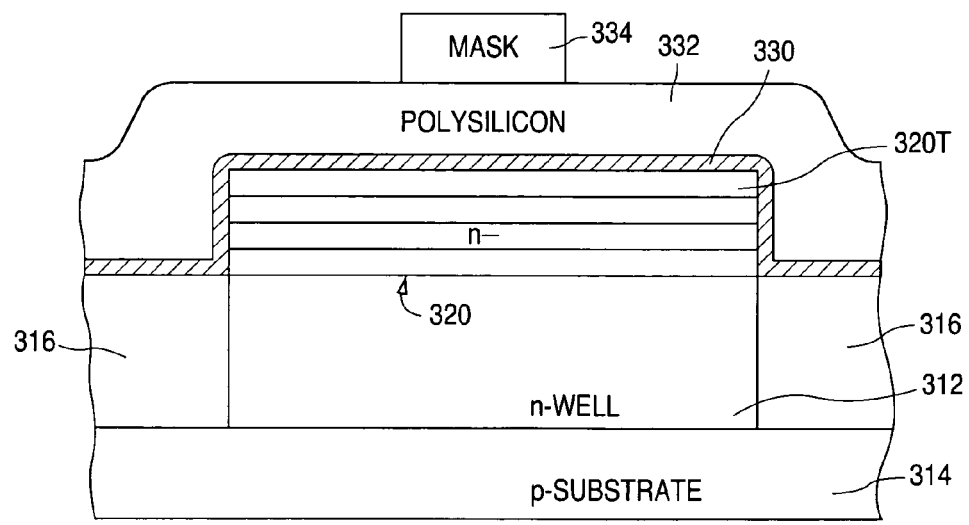

As shown in FIG. 3B, once mask 318 has been removed, a layer of insulation material 330, such as a layer of gate oxide, is formed over the exposed surfaces of composite layer 320. Following this, a layer of polysilicon 332 is formed on gate oxide layer 330. After polysilicon layer 332 has been formed, a mask 334 is formed and patterned on polysilicon layer 332. Next, polysilicon layer 332 is anisotropically etched to remove the exposed regions of layer 332 that are not protected by mask 334. Mask 334 is then removed.

Figure 3C:
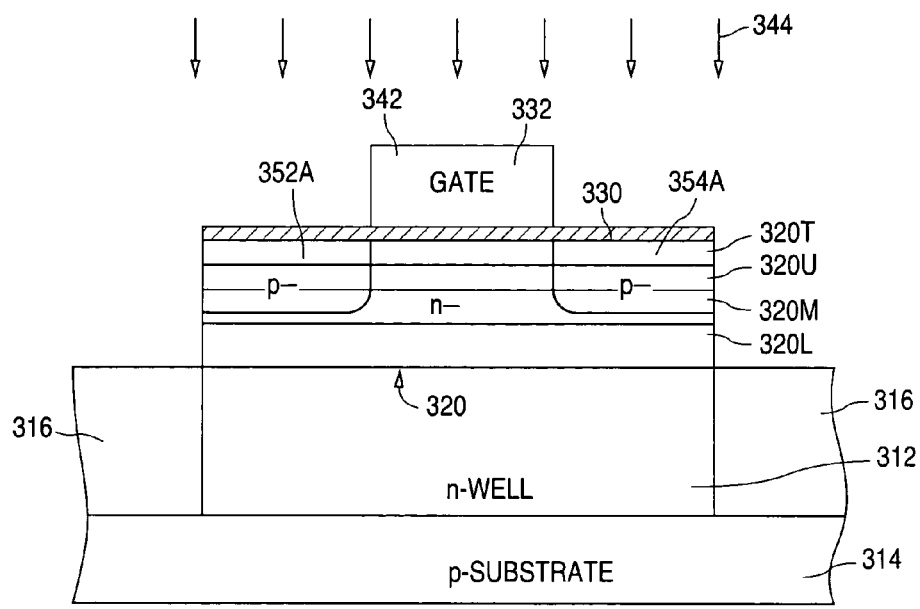
Figure 3D:
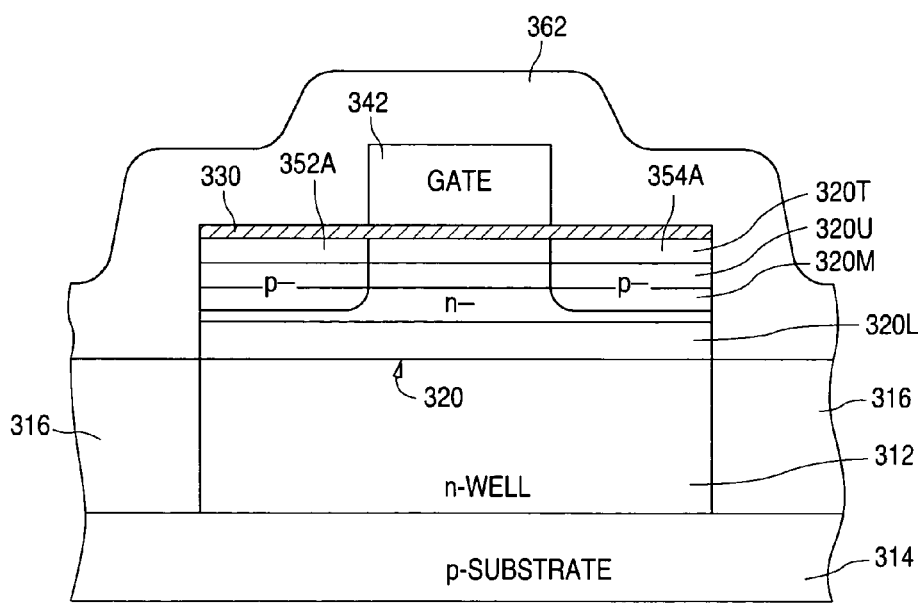

As shown in FIG. 3C, the etch forms a gate 342 from polysilicon layer 332. The method continues by implanting composite layer 320 and gate 342 with a p-type dopant 344. The implant dopes gate 342, and forms lightly-doped p-type regions 352A and 354A in composite layer 320. Turning to FIG. 3D, a layer of insulation material 362, such as an oxide, is next formed over trench isolation region 316, gate oxide layer 330, and gate 342.

Figure 3E:
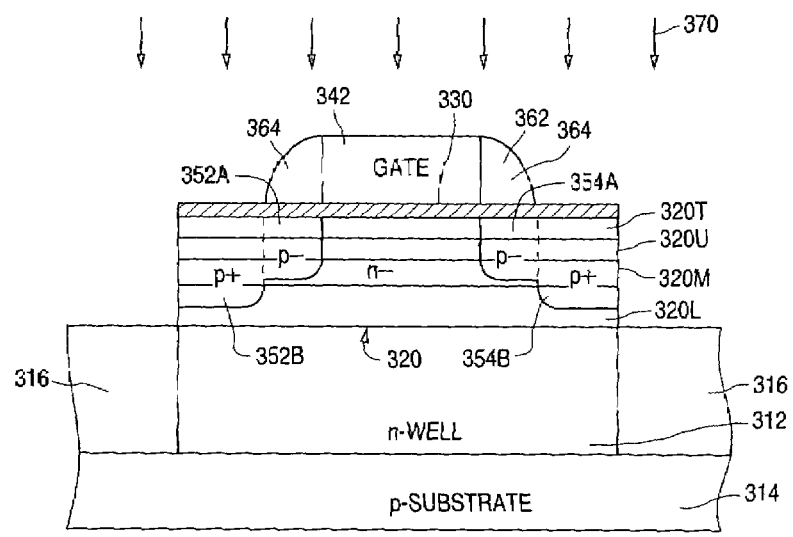

Following this, as shown in FIG. 3E, insulation material 362 is anisotropicly etched to remove insulation material from the top surfaces of trench isolation region 316, portions of layer 330, and gate 342. The anisotropic etch forms an insulating spacer 364 on the side walls of gate 342.

The method continues by again implanting composite layer 320 and gate 342 with p-type dopant atoms 370. During the second implant, insulating spacer 364 blocks dopant atoms from entering the portions of source region 352A and drain region 354A that lie below insulating spacer 364.

The second implant forms a heavily-doped p-type source region 352B that contacts adjacent lightly doped p-type source region 352A. In addition, the second implant also forms a heavily-doped p-type drain region 354B that contacts adjacent lightly-doped p-type drain region 354A. The second implant further dopes gate 342. Following the second implant, the wafer is annealed to repair lattice damage caused by the implants. After the wafer has been annealed, the method continues with conventional back end processing steps.

FIGS. 4A–4D show a series of cross-sectional views that illustrate a method of forming a PMOS transistor in accordance with the present invention. As above, the method utilizes a conventionally formed wafer that has an n-well 412 that is formed in a p-substrate 414. In addition, the wafer has a trench isolation region 416 that isolates n-well 412 from laterally adjacent regions. Further, n-well 412 and trench isolation region 416 have upper surfaces that are substantially coplanar.

Figure 4A:
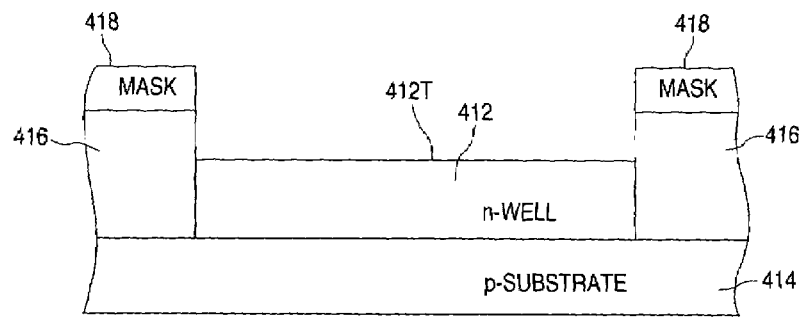
FIGS. 4A–4D are cross-sectional views illustrating an example of a method of forming a PMOS transistor in accordance with an alternate embodiment of the present invention.

As shown in FIG. 4A, the method begins by forming and patterning a mask 418 that exposes n-well 412. Next, the exposed regions of n-well 412 are etched to remove a portion of n-well 412 so that a top surface 412T of n-well 412 is recessed below the top surface of trench isolation region 416. Mask 418 is then removed.

Figure 4B:
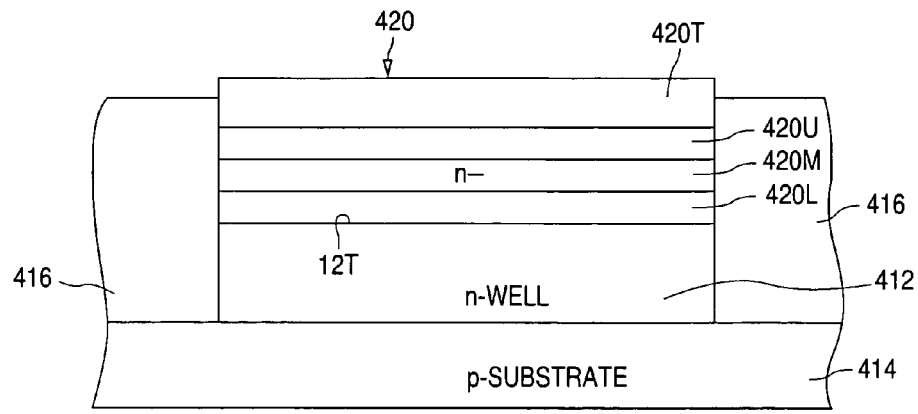

Next, as shown in FIG. 4B, a layer of composite material 420 is selectively epitaxially grown on the recessed surface 412T of n-well 412. (Composite layer 420 can alternately be epitaxially grown.) Composite layer 420 is formed by first forming a layer of n– silicon carbon 420L on the exposed surface of n-well 412. After this, a layer of n– silicon germanium 420M that is substantially free of carbon is formed on layer 420L, followed by the formation of a layer of n– silicon germanium carbon 420U on layer 420M. Next, a layer of cap silicon 420T that is free of carbon and germanium is formed on layer 420U.

Figure 4C:
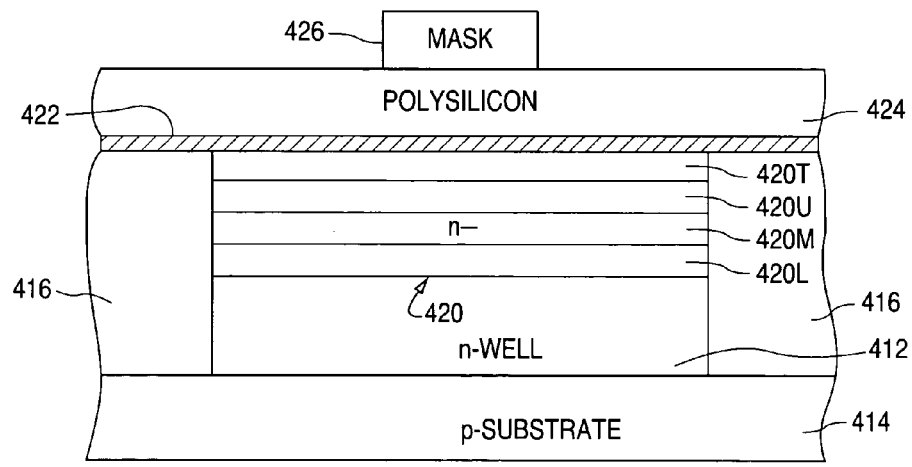

As shown in FIG. 4C, after composite layer 420 has been grown, layer 420 is planarized using, for example, chemical-mechanical polishing. The planarization step forms composite layer 420 with a substantially planar upper surface that is substantially coplanar with the upper surface of trench isolation region 416.

Once composite layer 420 has been formed and planarized, a layer of insulation material 422, such as a layer of gate oxide, is formed over the exposed surfaces of layer 420. Following this, a layer of polysilicon 424 is formed on gate oxide layer 422. After polysilicon layer 424 has been formed, a mask 426 is formed and patterned on polysilicon layer 424.

Figure 4D:
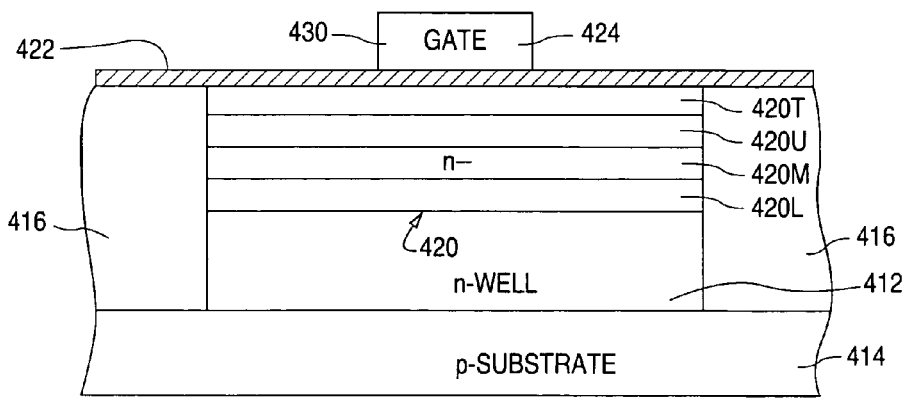

Next, as shown in FIG. 4D, polysilicon layer 424 is anisotropically etched to remove the exposed regions of layer 424 that are not protected by mask 426. Mask 426 is then removed. The etch forms a gate 430 from polysilicon layer 424. The method then continues as described above to form a source region, a spaced-apart drain region, and a side wall spacer. One of the advantages of the formation steps described in FIGS. 4A–4D is that a transistor can be formed that has significantly less variation in surface planarity.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a MOS transistor on a semiconductor material of a first conductivity type, the method comprising:

forming a layer of composite material of the first conductivity type on the semiconductor material, the layer of composite material including a first layer, a second layer that contacts a top surface of the first layer, a third layer that contacts a top surface of the second layer, and a fourth layer that contacts a top surface of the third layer, the first layer including silicon and carbon, the second layer including silicon and being substantially free of carbon, the third layer including silicon and carbon, the fourth layer including silicon and being substantially free of carbon;

forming an insulation layer on the layer of composite material;

forming a layer of conductive material on the insulation layer;

etching the layer of conductive material to form a gate; and forming spaced-apart source and drain regions of a second conductivity type in the layer of composite material on opposite sides of the gate, an isolation region adjoining the semiconductor material, the isolation region having a top surface, the semiconductor material having a top surface that is substantially coplanar with the top surface of the isolation region.

2. A method of forming a MOS transistor on a semiconductor material of a first conductivity type, the method comprising:

forming a layer of composite material of the first conductivity type on the semiconductor material, the layer of composite material including a first layer, a second layer that contacts a top surface of the first layer, and a third layer that contacts a top surface of the second layer, the first layer including silicon and carbon, the second layer including silicon and being substantially free of carbon, the third layer including silicon and carbon;

forming an insulation layer on the layer of composite material;

forming a layer of conductive material on the insulation layer;

etching the layer of conductive material to form a gate; and forming spaced-apart source and drain regions of a second conductivity type in the layer of composite material on opposite sides of the gate.

3. The method of claim 2 and further comprising:

forming a first material on a top surface of the semiconductor material before the layer of composite material is formed; and removing a portion of the first material to expose a region of the top surface of the semiconductor material and leave a remaining portion of the first material on the top surface of the semiconductor material, the layer of composite material being formed on the top surface of the semiconductor material and surrounded by the first material.

4. The method of claim 2 wherein the forming a layer of composite material includes:

removing a portion of the semiconductor material to expose an etched surface of the semiconductor material; and growing the layer of composite material on the etched surface of the semiconductor material.

5. The method of claim 4 and further comprising planarizing the layer of composite material.

6. The method of claim 2 wherein the layer of composite material includes a fourth layer that contacts a top surface of the third layer, the fourth layer including silicon and being substantially free of carbon.

7. The method of claim 6 wherein an isolation region adjoins the semiconductor material, the isolation region having a top surface, the layer of composite material having a top surface that lies above the top surface of the isolation region.

8. The method of claim 6 wherein the second and third layers include germanium.

9. The method of claim 8 wherein the fourth layer is substantially free of germanium.

10. The method of claim 6 wherein an isolation region adjoins the semiconductor material, the isolation region having a top surface.

11. The method of claim 10 wherein the forming a layer of composite material includes:

removing a portion of the semiconductor material to expose an etched surface of the semiconductor material, the etched surface of the semiconductor material lying below the top surface of the isolation region; and growing the layer of material on the etched surface of the semiconductor material.

12. The method of claim 11 and further comprising planarizing the layer of composite material so that the top surface of the layer of composite material and the top surface of the isolation region are substantially coplanar.

13. A method of forming a MOS transistor on a semiconductor material of a first conductivity type, the method comprising:

forming a layer of composite material of the first conductivity type on the semiconductor material, the layer of composite material including a first layer, a second layer that contacts a top surface of the first layer, and a third layer that contacts a top surface of the second layer, the first layer including silicon and carbon, the second layer including silicon and being substantially free of carbon, the third layer including silicon and carbon;

forming an insulation layer on the layer of composite material;

forming a layer of conductive material on the insulation layer;

etching the layer of conductive material to form a gate;

forming spaced-apart source and drain regions of a second conductivity type in the layer of composite material on opposite sides of the gate;

forming a first material on a top surface of the semiconductor material before the layer of composite material is formed;

removing a portion of the first material to expose a region of the top surface of the semiconductor material and leave a remaining portion of the first material on the top surface of the semiconductor material, the layer of composite material being formed on the top surface of the semiconductor material and surrounded by the first material; and removing the remaining portion of the first material from the top surface of the semiconductor material before the insulation layer is formed.

14. The method of claim 13 wherein an isolation region adjoins the semiconductor material, the layer of composite material having a top surface that lies above a top surface of the isolation region.

15. The method of claim 14 wherein the second and third layers include germanium.

16. The method of claim 15 wherein the layer of composite material includes a fourth layer that contacts a top surface of the third layer, the fourth layer including silicon and being substantially free of carbon.

17. The method of claim 16 wherein the fourth layer is substantially free of germanium.

18. The method of claim 17 wherein the composite layer is selectively epitaxially grown.

* * * * *